US008331907B2

(12) United States Patent
Jiang

(10) Patent No.: US 8,331,907 B2
(45) Date of Patent: Dec. 11, 2012

(54) INTEGRATING GSM AND WIFI SERVICE IN MOBILE COMMUNICATION DEVICES

(75) Inventor: Yue Jun Jiang, Danville, CA (US)

(73) Assignee: Roamware, Inc., San Jose, CA (US)

( * ) Notice: Subject to any disclaimer, the term of this patent is extended or adjusted under 35 U.S.C. 154(b) by 69 days.

(21) Appl. No.: 10/778,970

(22) Filed: Feb. 13, 2004

(65) Prior Publication Data

US 2004/0235455 A1    Nov. 25, 2004

Related U.S. Application Data

(60) Provisional application No. 60/448,000, filed on Feb. 18, 2003.

(51) Int. Cl.
*H04M 1/66* (2006.01)
*G06F 15/177* (2006.01)
*G06F 15/173* (2006.01)
*G06F 15/16* (2006.01)
*H04L 12/66* (2006.01)
*H04L 12/28* (2006.01)

(52) U.S. Cl. ........ 455/411; 709/229; 709/223; 709/202; 709/227; 370/352; 370/389

(58) Field of Classification Search ................ 455/411, 455/414, 432.3, 434; 370/352, 338
See application file for complete search history.

(56) References Cited

U.S. PATENT DOCUMENTS

| | | | |
|---|---|---|---|
| 5,353,328 A | 10/1994 | Jokimies | |
| 5,586,166 A | 12/1996 | Turban | |
| 5,742,910 A | 4/1998 | Gallant et al. | |
| 5,818,824 A | 10/1998 | Lu | |
| 5,854,982 A | 12/1998 | Chambers et al. | |
| 5,901,359 A | 5/1999 | Malmstrom | |
| 5,903,832 A | 5/1999 | Seppanen et al. | |
| 5,930,701 A | 7/1999 | Skog | |
| 5,940,490 A | 8/1999 | Foster et al. | |

(Continued)

FOREIGN PATENT DOCUMENTS

CA      2281041 A1    2/2001

(Continued)

OTHER PUBLICATIONS

"Digital cellular telecommunications system (Phase 2+); Specification of the SIM. Application Toolkit for the Subscriber Identity Module-Mobile Equipment (SIM-ME) interface (GSM 11.14 version 8.3.0 Release 1999)" ETSI TS 101 267 V8.3.0, Aug. 2000, pp. 1-69 and pp. 114-115 (XP-002222021).

(Continued)

*Primary Examiner* — Christopher M Brandt
*Assistant Examiner* — Muthuswamy Manoharan
(74) *Attorney, Agent, or Firm* — Arent Fox LLP

(57) ABSTRACT

A system that integrates Global System for Mobile Communications (GSM) and Wireless Fidelity (WiFi) wireless local area network (WLAN) services is provided. The system couples among components of a communications service provider and a provider of WiFi services to provide integrated cellular communications and wireless fidelity network services to users of mobile devices. The system monitors communications between the service provider and the mobile devices and automatically gathers identification information of the mobile devices. Upon authentication of the mobile devices via an exchange of information among the service provider infrastructures and the mobile devices, the system controls access of the mobile communication devices to WiFi services via the service provider infrastructure using the identification information.

35 Claims, 9 Drawing Sheets

U.S. PATENT DOCUMENTS

| | | |
|---|---|---|
| 5,943,620 A | 8/1999 | Boltz et al. |
| 5,953,653 A * | 9/1999 | Josenhans et al. ............ 455/410 |
| 5,987,318 A | 11/1999 | Alperovich et al. |
| 5,987,323 A | 11/1999 | Huotari |
| 5,987,325 A | 11/1999 | Tayloe |
| 6,014,561 A | 1/2000 | Mölne |
| 6,052,604 A | 4/2000 | Bishop et al. |
| 6,058,309 A | 5/2000 | Huang et al. |
| 6,075,855 A | 6/2000 | Christiansen et al. |
| 6,085,084 A | 7/2000 | Christmas |
| 6,138,005 A | 10/2000 | Park |
| 6,138,009 A | 10/2000 | Birgerson |
| 6,148,197 A | 11/2000 | Bridges et al. |
| 6,163,701 A | 12/2000 | Saleh et al. |
| 6,185,295 B1 | 2/2001 | Frederiksen et al. |
| 6,185,436 B1 | 2/2001 | Vu |
| 6,192,255 B1 | 2/2001 | Lewis et al. |
| 6,195,532 B1 | 2/2001 | Bamburak et al. |
| 6,208,864 B1 | 3/2001 | Agrawal et al. |
| 6,356,756 B1 | 3/2002 | Koster |
| 6,456,845 B1 | 9/2002 | Drum et al. |
| 6,456,859 B1 | 9/2002 | Desblancs et al. |
| 6,463,298 B1 | 10/2002 | Sorenson et al. |
| 6,466,786 B1 | 10/2002 | Wallenius |
| 6,505,050 B1 | 1/2003 | Brudos et al. |
| 6,574,481 B1 | 6/2003 | Rathnasapathy et al. |
| 6,603,761 B1 | 8/2003 | Wang et al. |
| 6,603,968 B2 | 8/2003 | Anvekar et al. |
| 6,611,516 B1 | 8/2003 | Pirkola et al. |
| 6,628,934 B2 * | 9/2003 | Rosenberg et al. ............ 455/411 |
| 6,671,523 B1 | 12/2003 | Niepel et al. |
| 6,684,073 B1 | 1/2004 | Joss et al. |
| 6,693,586 B1 | 2/2004 | Walters et al. |
| 6,738,622 B1 | 5/2004 | Stadelman et al. |
| 6,738,636 B2 | 5/2004 | Lielbriedis |
| 6,764,003 B1 | 7/2004 | Martschitsch et al. |
| 6,782,264 B2 * | 8/2004 | Anderson .................. 455/456.1 |
| 6,795,444 B1 | 9/2004 | Vo et al. |
| 6,856,818 B1 | 2/2005 | Ford |
| 6,876,860 B1 | 4/2005 | Berg et al. |
| 6,920,487 B2 | 7/2005 | Sofer et al. |
| 6,925,299 B1 | 8/2005 | Sofer et al. |
| 6,961,559 B1 | 11/2005 | Chow et al. |
| 6,963,543 B2 | 11/2005 | Diep et al. |
| 6,968,383 B1 | 11/2005 | Heutschi et al. |
| 6,975,852 B1 | 12/2005 | Sofer et al. |
| 6,978,156 B1 | 12/2005 | Papadopoulos et al. |
| 7,020,479 B2 | 3/2006 | Martschitsch |
| 7,139,570 B2 | 11/2006 | Elkarat et al. |
| 7,184,764 B2 | 2/2007 | Raviv et al. |
| 7,231,431 B2 | 6/2007 | Sofer et al. |
| 2002/0009199 A1 | 1/2002 | Ala-Laurila et al. |
| 2002/0012351 A1 | 1/2002 | Sofer et al. |
| 2002/0037708 A1 * | 3/2002 | McCann et al. ............. 455/411 |
| 2002/0087631 A1 | 7/2002 | Sharma |
| 2002/0101858 A1 * | 8/2002 | Stuart et al. ................... 370/352 |
| 2002/0101859 A1 | 8/2002 | MacLean |
| 2002/0160763 A1 | 10/2002 | Mittal et al. |
| 2002/0187780 A1 | 12/2002 | Souissi |
| 2002/0191575 A1 | 12/2002 | Kalavade et al. |
| 2002/0196775 A1 | 12/2002 | Tuohino et al. |
| 2003/0005034 A1 * | 1/2003 | Amin ........................... 709/202 |
| 2003/0017843 A1 | 1/2003 | Noblins |
| 2003/0050047 A1 | 3/2003 | Ala/Luukko |
| 2003/0051041 A1 * | 3/2003 | Kalavade et al. ............. 709/229 |
| 2003/0064723 A1 | 4/2003 | Thakker |
| 2003/0069922 A1 * | 4/2003 | Arunachalam ............... 709/203 |
| 2003/0129991 A1 | 7/2003 | Allison et al. |
| 2003/0133421 A1 | 7/2003 | Sundar et al. |
| 2003/0139180 A1 * | 7/2003 | McIntosh et al. ............. 455/426 |
| 2003/0208560 A1 | 11/2003 | Inoue |
| 2003/0224795 A1 | 12/2003 | Wilhoite et al. |
| 2003/0229791 A1 * | 12/2003 | De Jong ........................ 713/182 |
| 2004/0019539 A1 * | 1/2004 | Raman et al. .................. 705/29 |
| 2004/0053610 A1 | 3/2004 | Kim |
| 2004/0087305 A1 | 5/2004 | Jiang |
| 2004/0120552 A1 | 6/2004 | Borngraber et al. |
| 2004/0127204 A1 * | 7/2004 | Belmont ....................... 455/418 |
| 2004/0131023 A1 | 7/2004 | Auterinen |
| 2004/0132449 A1 * | 7/2004 | Kowarsch ................ 455/432.1 |
| 2004/0196858 A1 | 10/2004 | Tsai et al. |
| 2004/0229601 A1 | 11/2004 | Zabawskyj et al. |
| 2004/0236836 A1 | 11/2004 | Appelman |
| 2005/0021834 A1 | 1/2005 | Coulombe |
| 2005/0047378 A1 | 3/2005 | Wuschke et al. |
| 2005/0064883 A1 | 3/2005 | Heck et al. |
| 2005/0186939 A1 | 8/2005 | Barnea et al. |
| 2005/0186979 A1 | 8/2005 | McCann et al. |
| 2005/0215250 A1 | 9/2005 | Chava et al. |
| 2005/0232282 A1 | 10/2005 | Silver et al. |
| 2005/0250493 A1 | 11/2005 | Elkarat et al. |
| 2006/0003775 A1 * | 1/2006 | Bull et al. .................. 455/456.1 |
| 2006/0009204 A1 | 1/2006 | Ophir |
| 2006/0025129 A1 | 2/2006 | Wolfman et al. |
| 2006/0052113 A1 | 3/2006 | Ophir et al. |
| 2006/0068778 A1 | 3/2006 | Della-Torre |
| 2006/0068786 A1 | 3/2006 | Florence |
| 2006/0079225 A1 | 4/2006 | Wolfman et al. |
| 2006/0079236 A1 | 4/2006 | Del Pino et al. |
| 2006/0148459 A1 | 7/2006 | Wolfman et al. |
| 2006/0205404 A1 | 9/2006 | Gonen et al. |
| 2006/0211420 A1 | 9/2006 | Ophir et al. |
| 2007/0021118 A1 | 1/2007 | Ophir et al. |
| 2007/0049269 A1 | 3/2007 | Ophir et al. |
| 2007/0054665 A1 | 3/2007 | Elkarat et al. |
| 2007/0072587 A1 | 3/2007 | Della-Torre et al. |
| 2007/0178885 A1 | 8/2007 | Lev et al. |

FOREIGN PATENT DOCUMENTS

| | | |
|---|---|---|
| EP | 0899 974 A2 | 3/1999 |
| GB | 2322998 | 9/1998 |
| WO | WO 98/26621 A2 | 6/1998 |
| WO | WO 98/26626 A2 | 6/1998 |
| WO | WO 00/18156 | 3/2000 |
| WO | WO 00/51375 A | 8/2000 |
| WO | WO 00/79761 A | 12/2000 |
| WO | WO 00/79825 A | 12/2000 |
| WO | WO 01/22750 | 3/2001 |
| WO | WO 01/65884 A1 | 9/2001 |
| WO | WO 02/41641 A2 | 5/2002 |
| WO | WO 02/019667 | 7/2002 |
| WO | WO 03/019969 A1 | 3/2003 |
| WO | WO 03/043367 A | 5/2003 |
| WO | WO 03/065660 A | 8/2003 |
| WO | WO2004/075598 | 9/2004 |
| WO | WO 2004/081802 | 9/2004 |
| WO | WO2005/101857 | 10/2005 |
| WO | WO2008/012815 | 1/2008 |

OTHER PUBLICATIONS

"Digital cellular telecommunications system (Phase 2+); Universal Mobile Telecommunications System (UMTS); General Packet Radio Service (GPRS) Service description; Stage 2 (3GPP TS 23.060 version 5.4.0 Release 5)" ETSI TS 123 060 V5.4.0, Dec. 2002, pp. 1-207 (XP-014007573).

"Digital cellular telecommunications system (Phase 2+); Universal Mobile Telecommunications System (UMTS); General Packet Radio Service (GPRS); GPRS Tunnelling Protocol (GTP) across the Gn and Gp interface (3GPP TS 29.060 version 5.4.0 Release 5)" ETSI TS 129 060 V5.4.0, Dec. 2002, pp. 1-102 (XP-002298277).

Ala-Laurila, et al., "Wireless LAN Access Network Architecture for Mobile Operators," IEEE Communications Magazine, Nov. 2001, pp. 82-89 (XP-001107810).

Brünen, M. "Roaming im Zugangsnetz Mit OWLAN überall zu Hause sein," Net—Zeitschrift Fuer Kommunikationsmanagement, Huthig Verlag, Heilderberg, 2002, pp. 39-42 (XP-001122438).

GSM Association Permanent Reference Document: IR.33, PRD IR.33 "GPRS Roaming Guidelines," version 3.2.0, Apr. 3, 2003, pp. 1-20 (XP-002298278).

Ostrowski, F., "Roaming und Handover zwischen UMTS und Funk-LA," NTZ (Nachrichtentechnische zeitschrift), 2002, pp. 24-26 (XP-001124094).

Salkintzis, et al., "WLAN-GPRS Integration for Next-Generation Mobile Data Networks," IEEE Wireless Communications, Oct. 2002, pp. 112-123 (XP-001132263).

Telenor (origin GSMA), "Inter-PLMN Backbone Guidelines," S3z000005 3GPP TSG SA WG3 Security—S3#15bis, Ad-Hoc Meeting Nov. 8, 2000, pp. 1-30 (XP-002298276).

Salman A. Baset et al., "An analysis of the Skype Peer-to-Peer Internet Telephony Protocol", Department of Computer Science, Sep. 15, 2004, 12 pages.

GSM 378 on CAMEL Digital Cellular telecommunications system (Phase 2+);Customized Applications for Mobile network Enhanced Logic (CAMEL) Phase 2; Stage 2 (GSM 03.78 version 6.7.0 Release 1997).

GSM978 on CAMEL Application protocol Digital cellular telecommunications system (Phase 2+); Customized Applications for Mobile network Enhanced Logic (CAMEL); CAMEL Application Part (CAP) specification (GSM 09.78 version 7.1.0 Release 1998).

GSM 902 on MAP Specification Digital Cellular Telecommunications (Phase 2+); Mobile Application Part (MAP) Specification (3GPP TS 09.02 version 7.9.0 Release 1998).

Q760-Q769 on ISUP Signaling, Function and Procedure.

Q.761 (Functional description of the ISDN User Part of CCITT Signaling System No. 7).

Q762 (General Functions of CCITT Signaling System No. 7 ISDN User Part Messages and parameters).

Q 763 (Formats and codes of CCITT Signaling System No. 7 ISDN User Part Message and parameters).

Q 764 (1999), Signaling System No. 7—ISDN User Part signaling procedures.

Q 730 (1999), ISDN User Part supplementary services.

Q 711 (1996), Functional description of signaling connection control part.

Q 712 (1996), Definition and function of signaling connection control part messages.

Q713 (1996), Signaling connection control part formats and codes.

Q 714 (1996), Signal connection control part procedures.

Q 716 (1993), Signaling Connection Control Part (SCCP) performance.

GSM 340 on SMS Digital cellular telecommunications system (Phase 2+); Technical realization of the Short Message Service (SMS); (GSM 03.40 version 7.4.0 Release 1998).

SMPP Forum: SMPP Protocol Document Version: —Oct. 12, 1999 Issue 1.2.

Universal Mobile Telecommunications System (UMTS); Multimedia Messaging Service (MMS), Functional description; Stage 2 (3GPP TS 23.140 version 4.2.0 Release 4).

GSM 379 on CAMEL Digital cellular telecommunications system (Phase 2+); Customized Applications for Mobile network Enhanced Logic (CAMEL); CAMEL Application Part (CAP) specification (GSM.

Technical Specification3$^{rd}$ Generation Partnership Project; Technical Specification Group Services and System Aspects; Service accessibility (Release 1999).

Signaling procedure and the Mobile Application Part (MAP) (Release 1999).

Q1214-Q1218 on Intelligent Networks IMS architectures, 3GPP, and 3GPP2.

GMS 408 on radio interface layer 3; Digital cellular telecommunications system (Phase 2+); Mobile radio interface layer 3 specification (GSM 04.08 version 7.4.2 Release 1998).

GSM 322 network selection Digital cellular telecommunications system (Phase 2+); functions related to Mobile Station (MS) in idle mode and group receive mode (GSM 03.22 version 8.3.0 Release 1999).

GSM 23122 network selection 3GPP TS 23.122 V3.9.0 (Dec. 2002) Technical Specification; 3$_{rd}$ Generation Partnership Project; Technical Specification Group Core Network; NAS Functions related.

GSM 22011 service accessibility; 3 GPP TS 22.011 V3.8.0 (Sep. 2002) Technical Specification; 3$^{rd}$ Generation Partnership Project; Technical Specification Group Services and System Aspects; Service.

3 GPP 29010; 3 GPP TS 29.010 V3.10.0 (Dec. 2002); Technical Specification; 3$^{rd}$ Generation Partnership Project; Technical Specification Group Core Network; Information element mapping.

GSM 318 on CAMEL Basic Call Handling; Digital cellular telecommunications system (Phase 2+) Basic call handling; Technical realization (GSM 03.18 version 6.6.0 Release 1997).

ITU-T Recommendation Q. 766 (1993), Performance objectives in the integrated services digital network application.

ITU-T Recommendation Q. 765 (1998), Signaling system No. 7—Application transport mechanism.

ITU-T Recommendation Q. 769.1 (1999), Signaling system No. 7—ISDN user part enhancements for the support of Number Portability.

Q771-775X TCAP.

GSM 1111 SIM and Mobile Interface.

GSM 1114 SIM Toolkit.

IR 7320 Steering of Roaming.

GSM 348 Security and OTA.

GSM 31048 Security and OTA.

GSM 23119 Gateway Location Register.

GSM 408 Mobile Radio Interface Network Layer.

GSM 23122 Mobile Station Procedure.

GSM 24008 Mobile Radio Interface Network Layer.

GSM 25304 Idle Mode Selection.

GSM 29010 Error Network Mapping.

GSM 29002 MAP Protocol.

3G TS 22.078 version 3.2.0 Release 1999 UMTS CAMEL.

3G TS 23.278 version 6.0.0. Release 6 UMTS CAMEL-IMS interworking.

GSM 360 GPRS.

GSM 960 GPRS Tunneling Protocol.

GSM 23060 GPRS.

GSM 29060 GPRS Tunneling Protocol.

GSM 23012 Location Update.

Q701-705 on SS7 MTP.

M. Mouly, : "The GSM system for mobile communications", pp. 103-104. Cell and Sys, 1992.

"Universal mobile telecommunications system (UMTS) NAS Functions related to Mobile Station MS in idle mode" ETSI TS 123 122 V3.1.0, Jan. 2000, pp. 1-33.

"Digital cellular telecommunications system (Phase 2+) GSM; Universal Mobile Telecommunications System (UMTS); Mobile Radio Interface layer 3 specification; Core Network protocols, Stage 3" ETSI TS 124 008 V3.2.1, Jan. 2000, pp. 62-69 and 376.

* cited by examiner

600

Provide WiFi access to mobile device if login verified. 602

Maintain WiFi session database. 604

Initiate collection of session accounting information. 606

Receive notification when mobile device terminates WiFi access. 608

Receive charging request from WiFi provider. 610

Remove mobile device from the WiFi session login database. 612

Generate Call Detail Record. 614

Provide Call Detail Record to Service Provider. 616

Figure 6

INTEGRATING GSM AND WIFI SERVICE IN MOBILE COMMUNICATION DEVICES

RELATED APPLICATION

This application claims priority from U.S. Patent Application No. 60/448,000 filed Feb. 18, 2003.

TECHNICAL FIELD

The disclosed embodiments relate to portable communication networks and devices.

BACKGROUND

The use of wireless communication devices is ever increasing as a means for providing communication services and information to people on the go outside the home and office. These wireless communication devices include, for example, cellular telephones, personal digital assistants (PDAs), satellite telephones, portable telephones, Internet telephones, wireless communication devices/radios, personal computers (PCs), and similar devices that provide wireless access to voice and data communications. As a result of the proliferation of these wireless communication devices, numerous voice and data services have been made available to consumers, many of which are offered under an almost infinite number of different service plans provided by a large number of different service providers and/or system operators.

As an example, an individual might use a cellular telephone that operates to provide wireless access to voice communications and text messages under a Global System for Mobile Communications (GSM) service plan along with a portable computer or PDA that operates to provide wireless access to data via a network like the Internet using Wireless Fidelity (WiFi) services and technology provided under a different plan and/or service provider. As a consequence of the large numbers of services provided by most service providers, there is a need to integrate access to services like GSM and WiFi to make it easy for subscribers to access and be billed for the services.

Typically the integration of GSM and WiFi wireless local area network (WLAN) (WiFi WLAN) services by a service provider or system operator required the use of a custom client on the user's wireless device, where the custom client is coupled to a physical data Subscriber Identity Module (SIM) card which is a second SIM card of the device. In operation, authentication of the data SIM card was carried out by the client against information of a network signal gateway. The system configuration that supported this integration, therefore, was complex in that it required the use of the second SIM card (the GSM also uses a SIM card) and a complex authentication process involving transactions among the data SIM card, the custom client of the wireless device, a network gateway, and one or more other network components.

The typical GSM and WiFi service integration currently in use has a roaming user entering his/her telephone number during a WiFi login session and, in response to receipt of the telephone number, completes the login process by sending the user a personal identification number (PIN) via the user's mobile device or handset. This approach to service integration, however, results in a billing relationship between the WiFi service provider and the user's home service provider or operator rather than between the WiFi service provider and the visited network service provider in which the user is roaming. Consequently, the current attempts to integrate GSM and WiFi services result in lost revenue opportunities for the network in which the user is roaming.

BRIEF DESCRIPTION OF THE FIGURES

FIG. 6 is a flow diagram for providing accounting information of a WiFi session, under the embodiments of FIG. 1 and FIG. 2.

Figure 1:
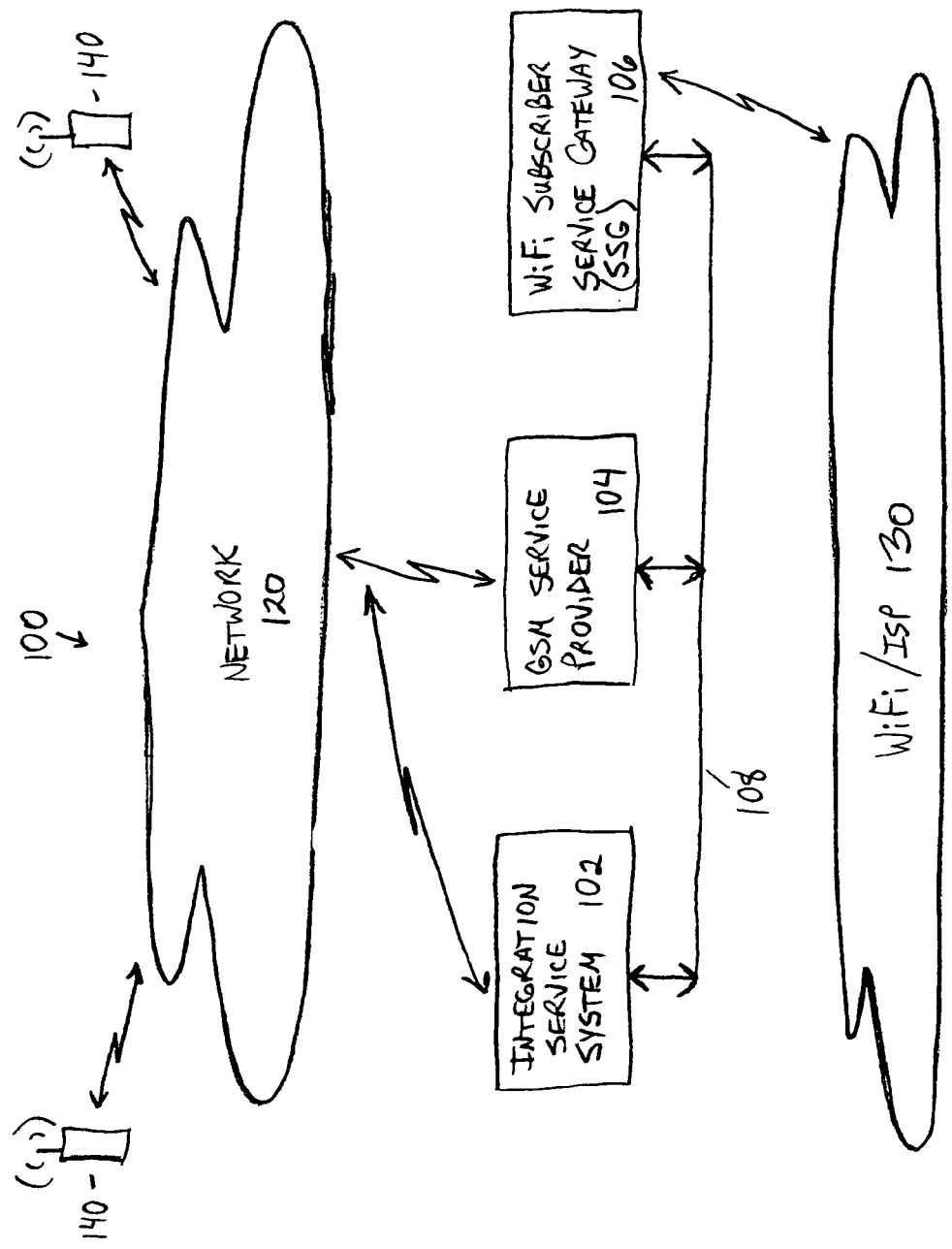
FIG. 1 is a block diagram of a communication system that includes an integration service system for integrating GSM and WiFi services, under an embodiment.

In the drawings, the same reference numbers identify identical or substantially similar elements or acts. To easily identify the discussion of any particular element or act, the most significant digit or digits in a reference number refer to the Figure number in which that element is first introduced (e.g., element 102 is first introduced and discussed with respect to FIG. 1).

DETAILED DESCRIPTION

An integration service system is provided that integrates Global System for Mobile Communications (GSM) and Wireless Fidelity (WiFi) wireless local area network (WLAN) services without the need for custom hardware or software on the wireless device. Specifically, the integration service system operates to provide seamless GSM and WiFi services without a custom client on the wireless device and without the need for a second Subscriber Identity Module (SIM) card.

The integration service system along with the associated methods couples among components of a communications service provider and a WiFi service provider to provide integrated cellular communications and wireless fidelity network services to roaming mobile communication devices. The integration service system monitors communications between the service provider and the mobile devices and automatically gathers identification information of the mobile devices. Upon authentication of the mobile devices via an exchange of information among the service provider infrastructure and the mobile devices, the integration service system controls access of the mobile communication devices to WiFi services via the service provider infrastructure using the identification information.

The integration service system described herein provides on-demand access to WiFi services and billing via at least one of a user's cellular telephone bill, credit card, and pre-paid card to name a few. Further, the integration service system eliminates both the need for a custom client and an additional data Subscriber Identity Module (SIM) card on the mobile device. Consequently, the integration service system also integrates GSM authentication and billing with that of the WiFi WLAN without the use of data SIM card authentication. The integration service system provides simplified authentication under both GSM and WiFi services by coupling the GSM authentication service with the registration activities of the user with a service provider (also generically referred to herein as Operator X) at the time of WiFi login and or the initiation of a WiFi session, as described below.

The integration service system described below allows the visited network service provider to provide billing and authentication to an inbound roamer. In particular, the integration service system allows the usage of WiFi service links via the registration of the roaming device with the visited network so to increase possible roaming revenue for the visited network service provider. In operation the roamer requests a PIN from the visited network service provider and authenticates with the WiFi service provided by the visited network service provider. The usage of WiFi services is continuously synchronized with the registration of the roamer at the visited network service provider, and any de-registration of the roamer with the visited network service provider triggers an alarm that can result in termination of the WiFi session in the absence of a new registration attempt.

The following description provides specific details for a thorough understanding of, and enabling description for, embodiments of an integration service system for integrating GSM and WiFi services. However, one skilled in the art will understand that the integration service system described herein may be practiced without these details. In other instances, well-known structures and functions have not been shown or described in detail to avoid unnecessarily obscuring the description of the embodiments of the integration service system.

FIG. 1 is a block diagram of a communication system 100 that includes an integration service system 102 for integrating GSM and WiFi services, under an embodiment. The communication system 100 includes the integration service system 102 coupled among service provider systems that include, for example, a GSM service provider 104 and/or other cellular service provider (not shown) and a WiFi Subscriber Service Gateway (SSG) 106 of a WiFi service provider, but the embodiment is not so limited. Each of the service provider systems 102, 104, and 106 are coupled for information exchange via network or bus couplings 108, where the couplings include at least one of wireless, wired, and hybrid wireless/wired couplings/connections. Further, the networks/network couplings 108 can include any of a number of network types known in the art including, but not limited to, local area networks (LANs), metropolitan area networks (MANs), wide area networks (WANs), proprietary networks, backend networks, and the Internet. Alternative embodiments can include couplings among the integration service system 102 and any number/type/combination of other service providers (not shown) via any number/type/combination of couplings (not shown).

The integration service system 102 and service provider systems 104 and 106 are coupled among a communication network 120 and a WiFi network 130, but can include any number/combination of additional networks and systems/subsystems (not shown). The communication network 120 and/or the WiFi network 130 and corresponding network couplings include any of a number of network types known in the art including, but not limited to, LANs, MANs, WANs, proprietary networks, backend networks, and the Internet. The communication network 120 of an embodiment uses at least one of GSM, General Packet Radio Service (GPRS), Code Division Multiple Access (CDMA), and Time Division Multiple Access (TDMA) communication protocols, but is not so limited.

Mobile devices 140 couple to the service provider systems 102, 104, and 106 via the communication network 120. The mobile devices 140 include, for example, cellular telephones, personal computers, portable computing devices, portable telephones, portable communication devices, subscriber devices or units, and personal digital assistants. The mobile devices 140, also referred to as "mobile communication devices," "portable communication devices" and "communication devices," can include all such devices and equivalents, and are not limited to communication devices that are wireless. The communication network 120 supports the transfer of information including voice and data signals between the mobile devices 140 and the service provider systems 102, 104, and 106 via at least one of wireless couplings, wired couplings, and a combination of wireless/wired couplings using one or more communication protocols known in the art.

A representative service description is provided below as an example of the integration service system 102 operating to provide integrated Global System for Mobile Communications (GSM) and Wireless Fidelity (WiFi) wireless local area network (WLAN) services to the mobile devices 140. This service description does not limit the integration service system 102 to this service example.

This service example assumes that a Service Provider, Operator X, offers both GSM mobile services and WiFi services. A user of a roaming mobile device, referred to as a roamer or an inbound roamer, wants to access the Internet via the WiFi services of Operator X. The roamer discovers the WiFi network and is presented with the home web page ("homepage") of Operator X upon launch of the Internet browser on the mobile device. The homepage includes login options for accessing the WiFi services, where the login options include at least one of user name and password/personal identification number (PIN) login for local Operator X GSM or ISP subscribers, credit card information, and prepaid card information.

For roamers inbound to the Operator X network, components of the Operator X network like the integration service system described above monitor roaming links of the GSM service, tracks the roamer's activities, and send the roamer a welcome SMS message that contains an advertisement for the WiFi services. As an example, an advertisement might include a message as follows: "Dial "*WiFi" to have a PIN sent to you in an SMS message to access Operator X WiFi services and get billed on your phone bill with a 10% discount".

If the inbound roamer chooses to access the WiFi services of Operator X using his/her GSM phone number, the roamer registers with Operator X to get a PIN if he/she does not have a current PIN. Upon receipt, the PIN is used to access the WiFi services. The PIN of an embodiment can be set to provide access for an unlimited period of time. Further, and as a security measure, the PIN can be set to expire using any number/combination of criteria, for example, the PIN expires after a certain amount of time has elapsed, after a pre-specified period of usage, and after a pre-specified period of inactivity. The roamer can dial "* WiFi" at any time to change a PIN or if the PIN is lost or forgotten.

Figure 2:
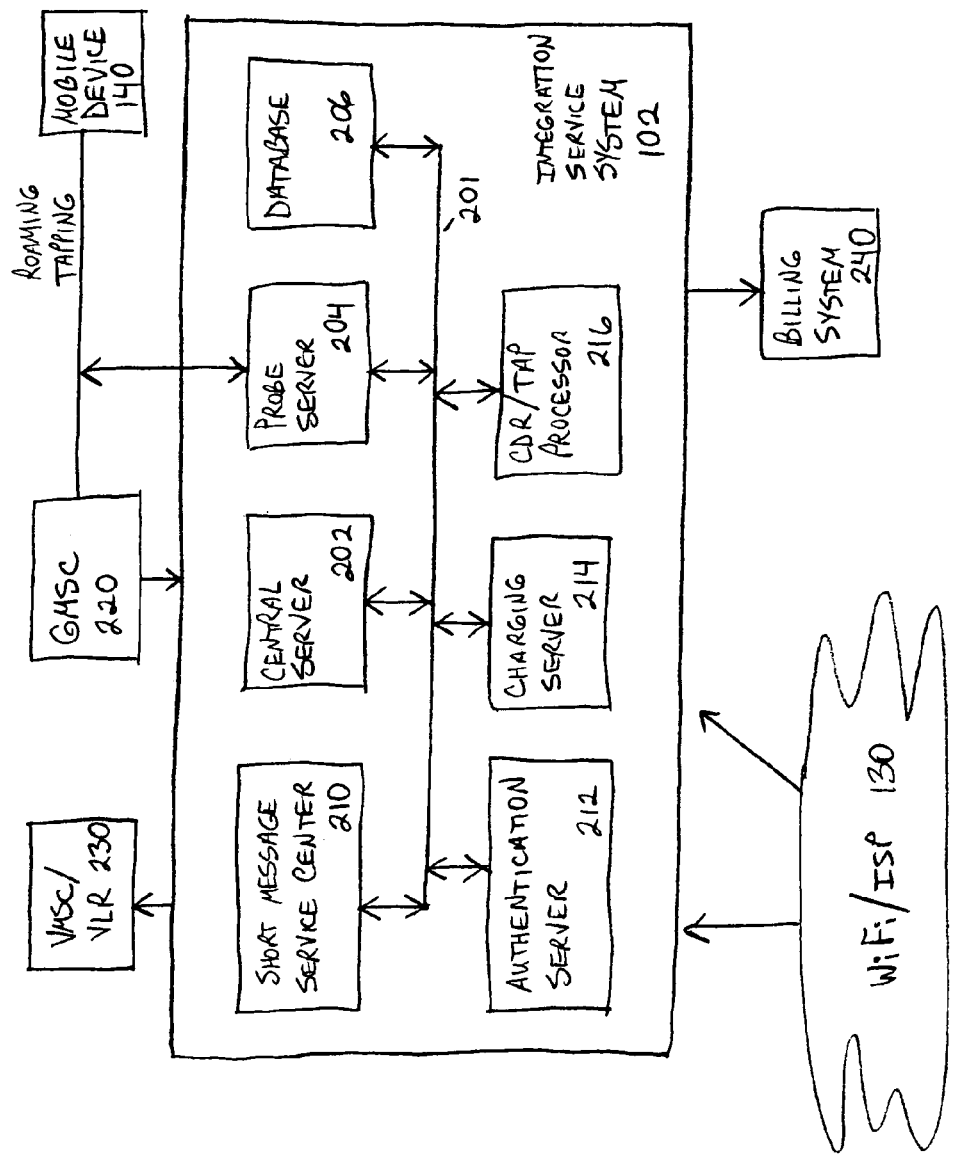
FIG. 2 is a block diagram of an integration service system, under the embodiment of FIG. 1.

FIG. 2 is a block diagram of an integration service system 102, under an embodiment. The integration service system 102 includes multiple functions, as described below, that are hosted in and/or distributed across one or more components, systems, and/or algorithms. Components of the integration service system 102 include at least one of a central server 202, a probe server 204, and a database 206, but are not so limited. Each of the central server 202, probe server 204, and the database 206 are coupled for communication via at least one bus or network coupling 201. The integration service system 102 further includes at least one of a short message service center 210, an authentication server 212, a charging server 214, and a Call Detail Record/Transfer Accounting Procedure (CDR/TAP) processor 216, but is not so limited.

Various components 201-216 of the integration service system interface with at least one of a Gateway Mobile Switching Center (GMSC) 220, a Visited Mobile Switching Center (VMSC)/Visited Location Register (VLR) (VMSC/VLR) 230, and a WiFi/Internet Service Provider (ISP) 130, to name a few. Billing services are provided via at least one coupling with an accounting or billing system 240. Note that alternative embodiments of the integration service system 102 can incorporate one or more components/functions of the GMSC 220, the VMSC/VLR 230, the WiFi/ISP 130, and the billing system 240. Operations of the integration service system 102 are described below in further detail.

Figure 3:
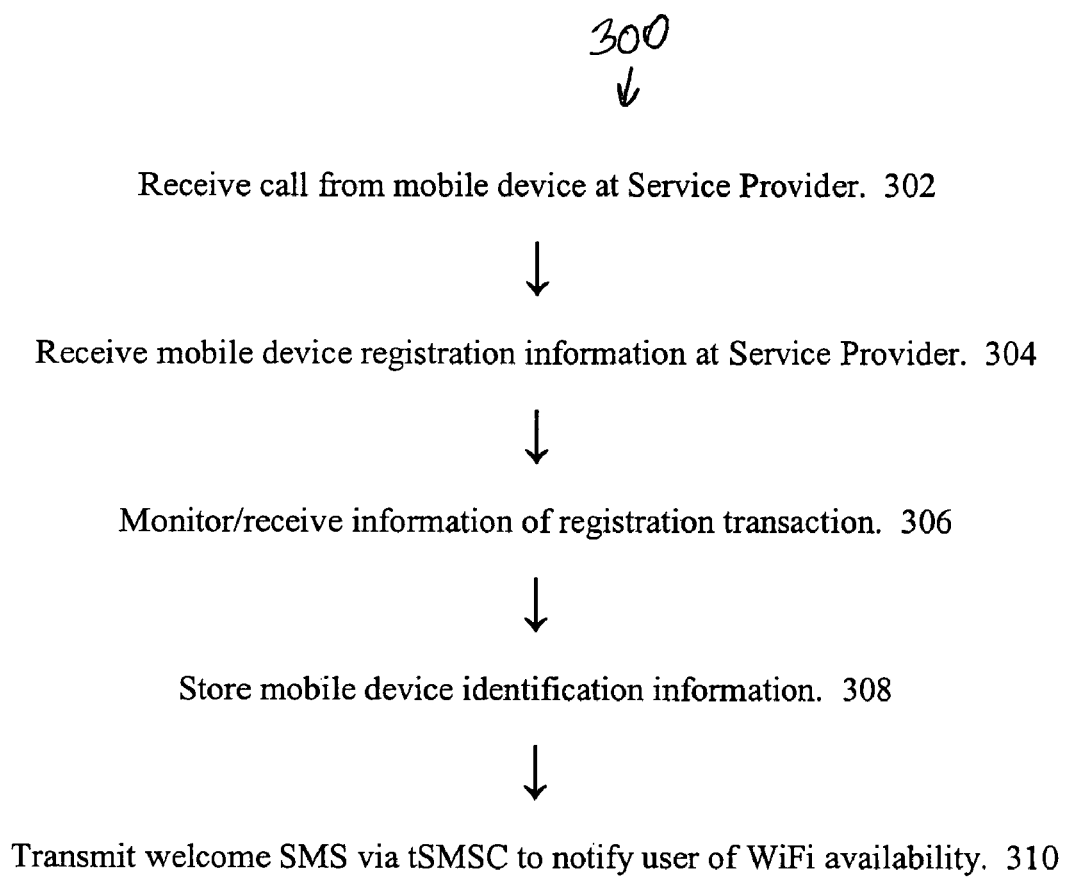
FIG. 3 is a flow diagram for advertising WiFi service availability and providing WiFi service information to an inbound roamer, under the embodiments of FIG. 1 and FIG. 2.
Figure 4:
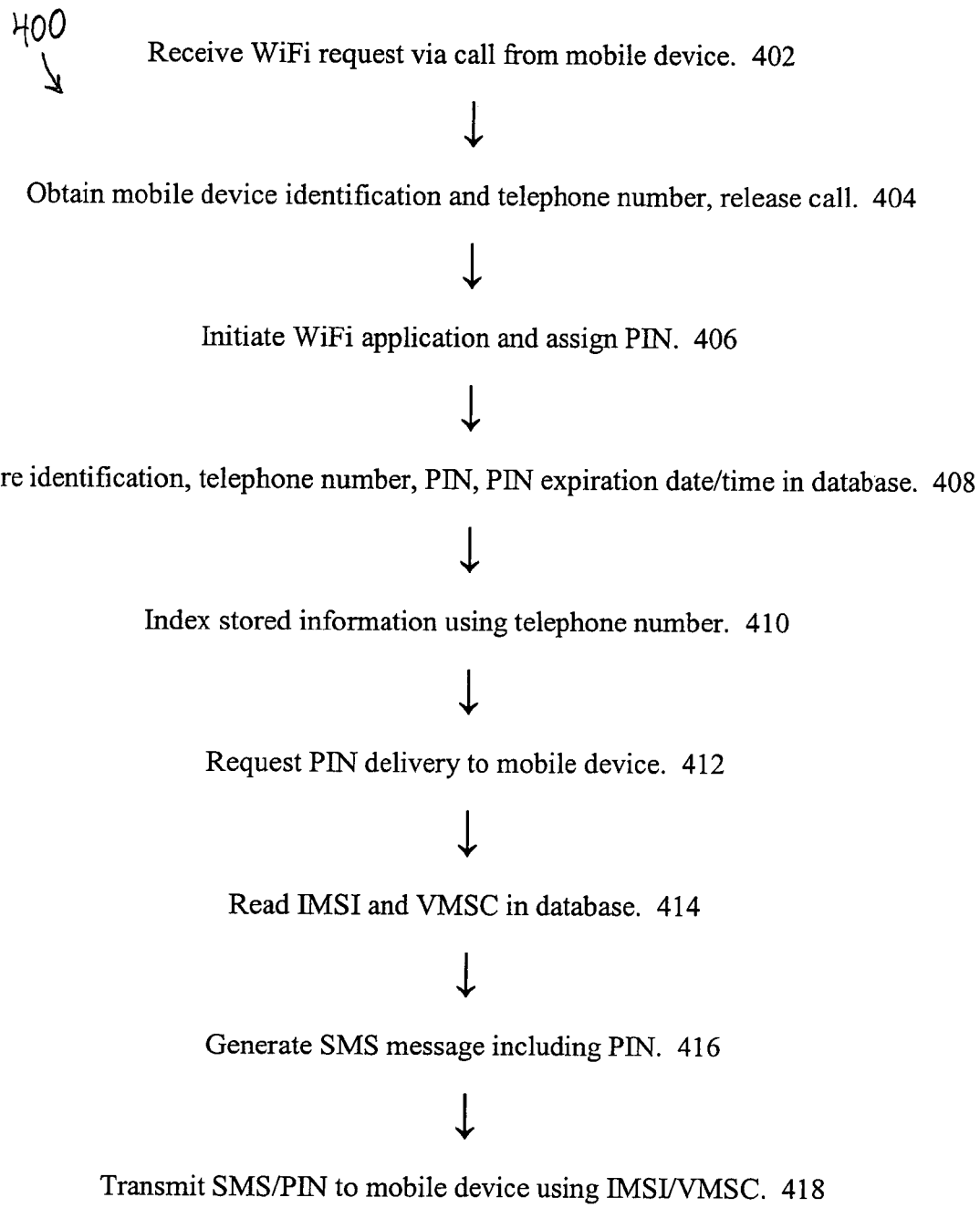
FIG. 4 is a flow diagram for providing WiFi service access information to an inbound roamer, under the embodiments of FIG. 1 and FIG. 2.
Figure 5:
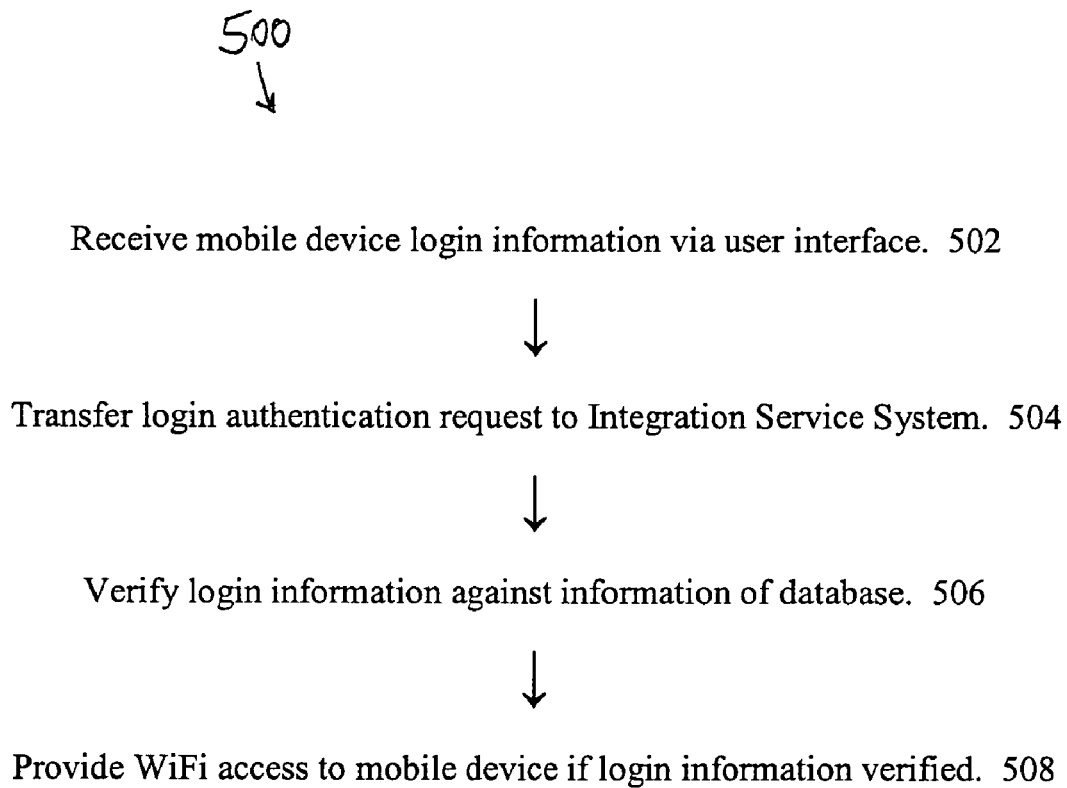
FIG. 5 is a flow diagram for providing WiFi service to an inbound roamer, under the embodiments of FIG. 1 and FIG. 2.

FIGS. 3-6 show flow diagrams 300-600 of operations of the integration service system of an embodiment, and are described in detail below. FIG. 3 is a flow diagram 300 for advertising WiFi service availability and providing WiFi service information to an inbound roamer, under the embodiments of FIG. 1 and FIG. 2. FIG. 4 is a flow diagram 400 for providing WiFi service access information to an inbound roamer, under the embodiments of FIG. 1 and FIG. 2. FIG. 5 is a flow diagram 500 for providing WiFi service to an inbound roamer, under the embodiments of FIG. 1 and FIG. 2. FIG. 6 is a flow diagram 600 for providing accounting information of a WiFi session, under the embodiments of FIG. 1 and FIG. 2. These flow diagrams are described below.

As generally described above, components of the Service Provider that include the integration service system monitor roaming links of the GSM service for roaming mobile devices inbound to the network, track the roamer's activities, and send the roamer a welcome SMS message that contains an advertisement for the WiFi services. With reference to the flow diagram 300 for advertising WiFi service availability and providing WiFi service information to an inbound roamer (FIG. 3), this process begins when the Service Provider receives a call and/or a registration transmission from an inbound roaming mobile device, at block 302. The Service Provider receives registration information of the mobile device via this incoming call, at block 304. The Integration Service System monitors the registration transaction between the Service Provider and the mobile device via roaming tapping, at block 306.

Components of the Integration Service System receive identification information from the mobile device as a result of tapping the information transfer between the mobile device and the Service Provider, and store the identification information in at least one database, at block 308. The mobile device identification information includes at least one of a device telephone number, at least one identification number associated with the mobile device and components of the mobile device, an International Mobile Subscriber Identity (IMSI), a Mobile Country Code (MCC), a Mobile Network Code (MNC), a Mobile Station Identification Number (MSIN), a Mobile Station International Integrated Service Digital Network (ISDN) Number (MSISDN), a Number Assignment Module (NAM), and information of a subscriber.

In response to receipt of the identification information, components of the Integration Service System transmit a welcome message to the mobile device via a SMS message. In one embodiment, the tSMSC of the Integration Service System generates and transmits the welcome message. The welcome message advertises the availability of WiFi services provided by and/or accessed through the Service Provider and provides instructions for accessing the WiFi services, for example, at block 310.

Once the instructions for accessing the WiFi services are received by the roaming mobile device, the user of the mobile device can use the instructions to initiate access to the WiFi services. Referring to the flow diagram 400 for providing WiFi service access information to an inbound roamer (FIG. 4), a user wishing to access the WiFi services initiates a WiFi service request by dialing a particular number or code received in the SMS message, at block 402. As an example, the user might dial "*WiFi". Components of the Integration Service System receive the WiFi access request call from the mobile device and obtain information of the mobile device including the mobile device telephone number and at least one identification number associated with the mobile and components of the mobile device, at block 404. The central server of the Integration Service System receives the request call in an embodiment, but is not so limited. The request call is released after the mobile device identification information is obtained.

The components of the Integration Service System, in response to the request call, initiate a WiFi application as appropriate, at block 406. In response to initiation of the WiFi application, a PIN is generated or assigned to the session; the PIN can be generated by at least one of the WiFi application, components of the Service Provider, and components of the Integration Service System, but is not so limited. The mobile device identification information along with the telephone number, the PIN, and an expiration date/time of the PIN are stored in a database, for example the Integration Service System database, at block 408, or in the alternative any other database coupled to at least one of the Integration Service System and the Service Provider. Components of the Integration Service System index information of the database using the mobile device telephone number, at block 410; while this indexing scheme supports re-requests and changes of PINs, alternative embodiments can use other indexing schemes.

Upon generation of the PIN, components of the Integration Service System request delivery of the PIN to the requesting mobile device, at block 412. Components of the Integration Service System read information of the requesting mobile device from the database, where the information includes at least one of the International Mobile Subscriber Identity (IMSI) and the Visited Mobile Switching Center (VMSC), at block 414. Components of the Integration Service System generate the SMS message that includes the PIN, at block 416, and use the information of the database to transmit the SMS message to the requesting mobile device, at block 418.

In an embodiment, the central server of the Integration Service System transmits a request to the tSMSC requesting delivery of the PIN to the requesting mobile device. The tSMSC of the Integration Service System reads the IMSI and the VMSC from the database, generates the SMS message that includes the PIN, and transmits the SMS message to the requesting mobile device.

Upon receipt of the SMS message that includes the PIN and any other information necessary for accessing the WiFi services at the mobile device, a user has the information necessary to initiate access to the WiFi services as appropriate. At such time as the mobile device user wishes to access WiFi service, and with reference to the flow diagram 500 for providing WiFi service to an inbound roamer (FIG. 5), components of the Integration Service System receive mobile device login information via components of the Service Provider, at block 502. The Service Provider transfers information of the login authentication request to components of the Integration Service System, at block 504.

In an embodiment the user logs in using a user interface provided on one or more Internet access pages of the Service Provider via use of the mobile device telephone number, for example. The components of the Service Provider transfer the login authentication request information to the authentication server of the Integration Service System via messages using HyperText Transmission Protocol (HTTP)/HyperText Transmission Protocol, Secure (HTTPS), but alternative embodiments can use alternative protocols.

Continuing, components of the Integration Service System compare the information of the login authentication request with information of the database, at block 506. Optionally, the Integration Service System determines if the requesting roamer remains registered with the Service Provider as an additional security measure. Components of the Integration Service System provide WiFi access to the requesting mobile device if the login authentication request information is verified against information of the database, at block 508; otherwise WiFi access is denied.

Upon initiation of a WiFi session, session records and the corresponding accounting information are generated, under an embodiment. Referring to the flow diagram 600 for providing accounting/billing information of a WiFi session (FIG. 6), operation begins when components of the Integration Service System verify login authentication request information and provide WiFi access to the requesting mobile device, at block 602. Components of the Integration Service System maintain a session login database corresponding to each WiFi session upon initiation of the session, at block 604. The collection of session accounting information is initiated by components of the WiFi provider like the WiFi Subscriber Service Gateway (SSG) with components of the Integration Service System like the charging server, at block 606, but is not so limited.

The collection of session accounting information or data continues until such time as the user terminates the session. When the user signs off or terminates the session, the Integration Service System receives notification of the termination event from the WiFi provider, at block 608. The Integration Service System then receives a charging request from the WiFi provider, at block 610. In an embodiment, the Integration Service System charging server receives the charging request from the WiFi SSG via a message using the HTTPS protocol, but is not so limited. The charging request includes a request for information as to at least one of an amount of usage or a corresponding charge for the session.

In response to receipt of the session termination message, components of the Integration Service System remove the user from the WiFi session login database, at block 612. The Integration Service System then generates a Call Detail Record (CDR), at block 614, and provides the CDR to the Service Provider, at block 616. The CDR is generated to cover a pre-specified period of time like a day, a pre-specified block of time, or the period of a session. The CDR is used to generate billing information for the user. The CDR can, for example, be provided to the user's cellular telephone service provider for inclusion on the user's cellular telephone bill, thereby eliminating the need for a separate billing invoice.

An example is described below using a representative signal flow through a communication system 800 that includes an integration service system 803 for integrating GSM and WiFi services along with a WiFi SSG 802. The example assumes a communication system configuration that provides an inbound roamer or user 801 with an initial session of free access to the WiFi services, where the initial session has a pre-specified time limit. The user can terminate access to the WiFi services at any time during the initial session. If the initial session remains in progress at the end of the pre-specified time limit, the user receives a message indicating that the initial session has ended and is given an opportunity to continue under a billing option of the user's choice. The communication system continues to provide access to the WiFi services when the user chooses to continue by selecting a billing option; otherwise access to the WiFi services is terminated.

Figure 7:
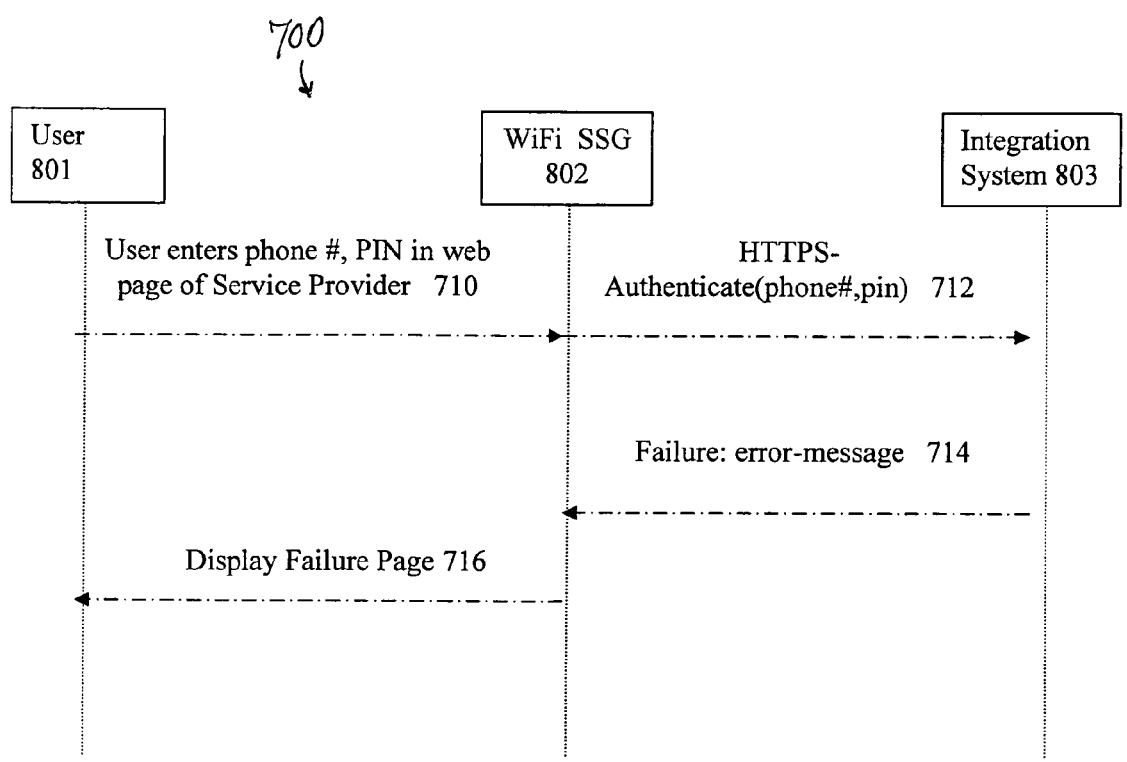
FIG. 7, which is a signal flow diagram for denial of a WiFi service request, under the embodiment of FIG. 1.

The example begins with reference to FIG. 7, which is a signal flow diagram 700 for denial of a WiFi service request, under the embodiment of FIG. 1. Operation begins when the user 801 navigates to one or more web pages using the mobile device and provides login authentication information (cellular telephone number and PIN as appropriate) 710 via a user interface. The login authentication information 710 is received at the WiFi SSG 802. The WiFi SSG 802 transfers the login authentication information to integration service system 803 via a message 712 using HTTPS protocol. Components of the Integration Service System 803, unable to verify the login authentication information, transfer an error message 714 to the WiFi SSG 802 that indicates failure to verify the login authentication information. The WiFi SSG 802 issues a failure notification to the user 801/mobile device in response to the error message and access to WiFi services is denied.

Figure 8A:
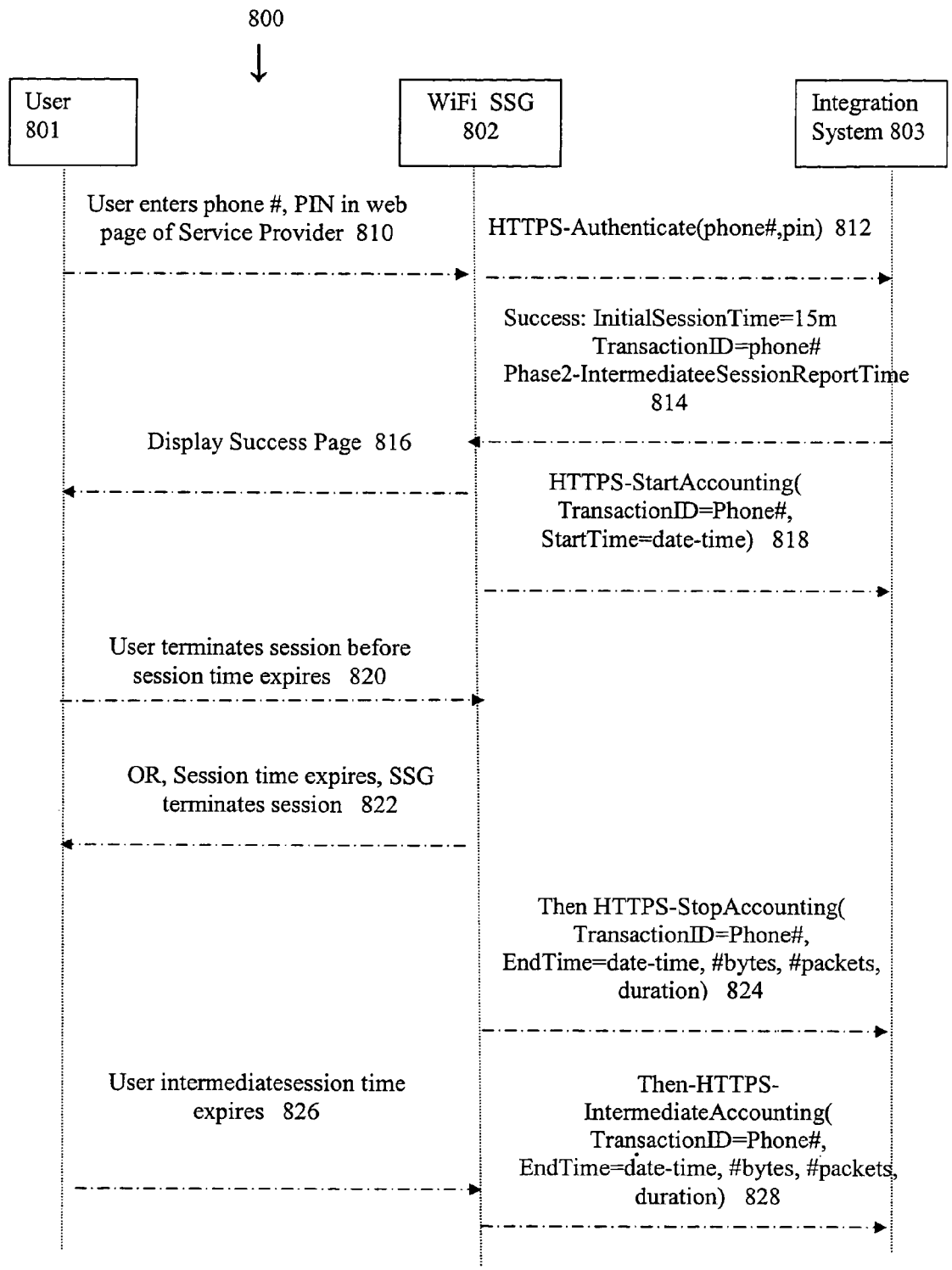
FIG. 8A and FIG. 8B show a signal flow diagram for providing WiFi services to a mobile device, under the embodiment of FIG. 1.
Figure 8B:
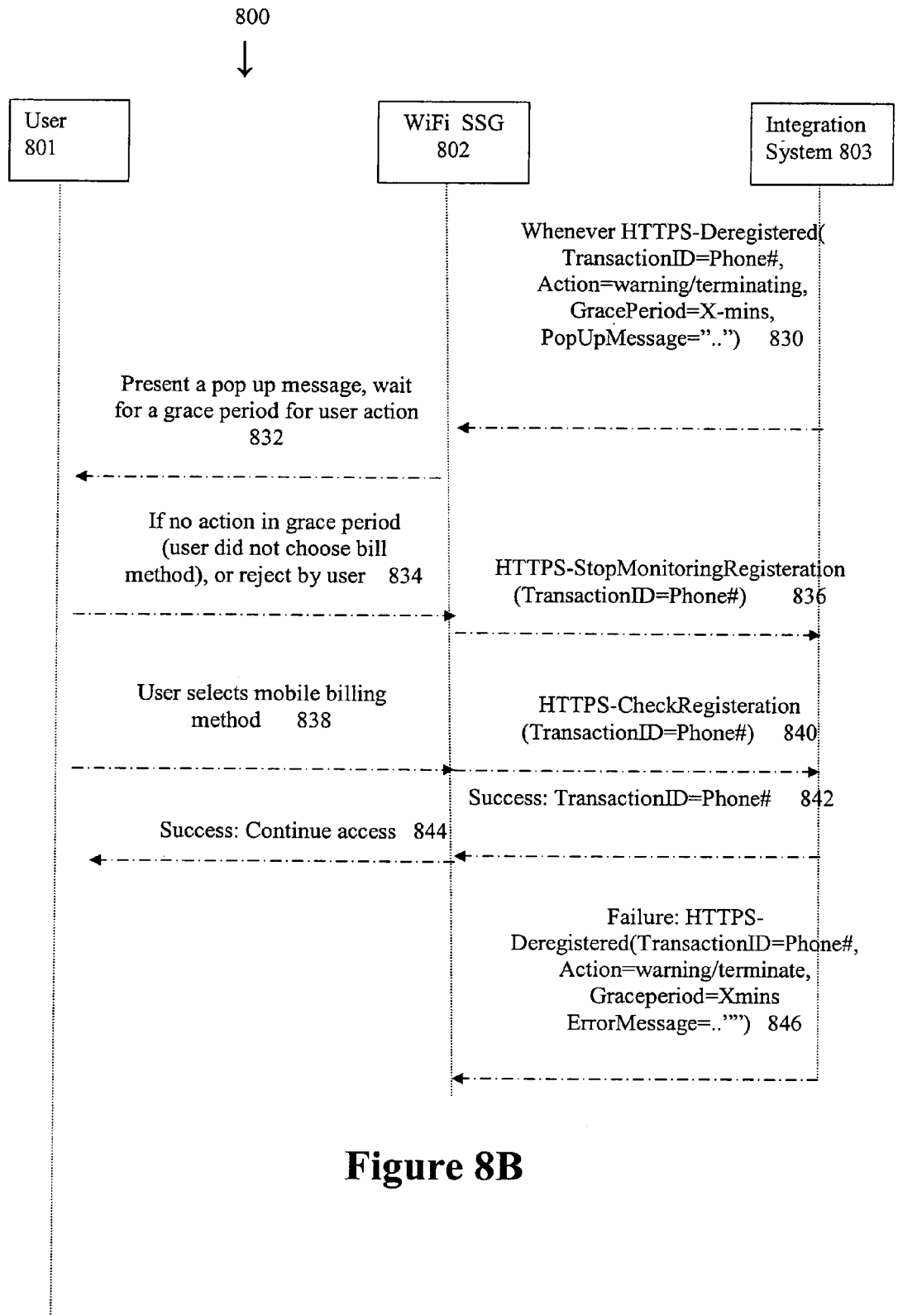

The example continues with reference to FIG. 8A and FIG. 8B, which form a signal flow diagram 800 for providing WiFi services to a mobile device, under the embodiment of FIG. 1. Operation begins when the user 801 navigates to one or more web pages using the mobile device and provides login authentication information (cellular telephone number and PIN as appropriate) 810 via a user interface. The login authentication information 810 is received at the WiFi SSG 802. The WiFi SSG 802 transfers the login authentication information to the integration service system 803 via a message 812 using, in one embodiment, HTTPS protocol. Components of the Integration Service System 803, upon verifying the login authentication information, transfer a success message 814 to the WiFi SSG 802 that indicates a successful verification of the login authentication information. The WiFi SSG 802, in response, provides a success message 816 to the user 801 and subsequent access to the WiFi Services by the mobile device for the initial session, and transfers a message 818 to the Integration Service System 803 (using the HTTPS protocol, for example) to initiate collection of the initial session accounting information. The initial session has a pre-specified time period, for example fifteen (15) minutes.

The initial session of WiFi access ends either when a termination message 820 is received at the WiFi SSG 802 from the user 801 or when the WiFi SSG 802 issues a termination message 822 to the user 801 warning about the approaching time limit of the initial session. Regardless of how session termination is initiated, the WiFi SSG 802 transmits a message 824 to the Integration Service System 803 (using the HTTPS protocol, for example) to stop collection of the initial session accounting information.

When the initial session of WiFi access is set to expire, the WiFi SSG 802 receives a message 826 from the user indicating expiration of the pre-specified time. The WiFi SSG 802 in turn transmits a message 828 to the Integration Service System 803 (using the HTTPS protocol, for example) regarding intermediate accounting information. The Integration Service System 803, in response, transmits a deregistration message to the WiFi SSG 802 which in turn provides a session expiration warning message 832 to the user 801 and initiates a grace period during which the user has time to elect to continue WiFi access. Upon receipt of a message 834 from the user indicating a desire to terminate the WiFi session or upon expiration of the grace period with no response received from the user 801, the WiFi SSG 802 terminates the WiFi session and issues a message 836 to the Integration Service System 803 to cease monitoring of the session.

When the user 801 wishes to continue the current WiFi session, the user initiates a message 838 to the WiFi SSG 802 via the mobile device, as appropriate. The message 838 of an embodiment includes information as to a billing/payment method under which the user will continue the session, but is not so limited. As an example, the message 838 can include information of an election by the user 801 to continue the session and have it billed through at least one of his/her service provider, a credit card, and at least one pre-paid card. If the user 801 elects to use a credit card or pre-paid card as payment then the information of the message 838 includes at least one of credit card information (card number, expiration date, etc.) and pre-paid card information.

Regardless of the billing/payment method selected, the WiFi SSG 802 receives the message 838 that includes one of an election to bill the continued session through the service provider or the billing/payment information of a credit/prepaid card. The WiFi SSG 802 transfers information of the received message 838 as appropriate to the integration service system 803 via a message 840 using HTTPS protocol, for example. Components of the Integration Service System 803, upon verifying one of the registration of the user with the service provider (service provider billing) or verifying the billing/payment information (credit/pre-paid card), generate a success message 842 that indicates a successful registration/verification of the information. The Integration Service System transfers the success message 842 to the WiFi SSG 802. The WiFi SSG 802, in response to successful receipt of the success message 842, provides a success message 844 to the user 801 and subsequent continued access to the WiFi Services by the mobile device.

When components of the Integration Service System 803 are unable to verify registration of the user with the service provider or the billing/payment information, the Integration Service System 803 generates and transfers a failure message 846 to the WiFi SSG 802. Continued access to WiFi services by the user 801 are subsequently denied in response to the failure message 846.

A system that integrates GSM and WiFi services is provided herein. The system couples among components of two or more communications service providers and roaming mobile communication devices, wherein the system automatically gathers identification information of a mobile device via monitoring communications between a first service provider and the mobile device, launches a service application under a second service provider and provides service application identification information to the mobile device, and controls access to the service application in response to a request from the mobile device that includes the service application identification information. In an embodiment the first service provider is a Global System for Mobile Communications (GSM) service provider and the second service provider is a Wireless Fidelity (WiFi) service provider.

The system of an embodiment includes a device comprising at least one of: a first system coupled to monitor a first communication channel among service providers and at least one mobile device and receive mobile device identification information; a second system coupled among the first system and a Wireless Fidelity (WiFi) application, wherein the second system activates the WiFi application in response to a request from the mobile device, generates WiFi application identification information, and transmits the WiFi application identification information to the requesting mobile device; and a third system coupled among the first and second systems to receive an authentication request to the WiFi application from the mobile device, and controls access of the mobile device to the WiFi application in response to the authentication request.

The device further comprises a messaging system that transmits a first wireless message to the mobile device in response to receipt of the mobile device identification information, wherein the request from the mobile device is an electronic request for WiFi service access generated by the mobile device using information of the first wireless message.

The second system of the device of an embodiment transmits the WiFi application identification information to the mobile device via a second wireless message, wherein the WiFi application identification information includes a personal identification number (PIN).

The device further comprises at least one database for storage of mobile device identification information that includes at least one of a device telephone number, at least one identification number associated with the mobile device and components of the mobile device, an International Mobile Subscriber Identity (IMSI), and the WiFi application identification information.

The mobile device of an embodiment includes at least one of cellular telephones, personal computers, portable computing devices, portable telephones, portable communication devices, subscriber devices or units, and personal digital assistants.

The first communication link of an embodiment includes a cellular communication channel.

The service providers of an embodiment include at least one Global System for Mobile Communications (GSM) service provider and at least one Wireless Fidelity (WiFi) wireless local area network (WLAN) service provider.

Methods for providing integrated communication services and wireless local area network (WLAN) services to mobile devices are provided herein, comprising at least one of: monitoring wireless channels between a first service provider and a mobile device; receiving device identification information via the monitoring; automatically transmitting a first wireless message to the mobile device in response to receipt of the device identification information; receiving a request for WLAN access from the mobile device; activating at least one WLAN application under a second service provider; automatically transmitting application identification information to the mobile device; receiving an authentication request to the WLAN application from the mobile device; and controlling access of the mobile device to the WLAN application in response to the authentication request.

The request for WLAN access in an embodiment is generated using information of the first wireless message.

The first wireless message of an embodiment includes a Short Message Service (SMS) message.

The method of an embodiment further comprises generating application identification information associated with the WLAN application.

In the method of an embodiment the application identification information is transmitted to the mobile device using a second wireless message. The second wireless message includes a Short Message Service (SMS) message, for example.

In an embodiment the first service provider includes a Global System for Mobile Communications (GSM) service provider and the second service provider includes a Wireless Fidelity (WiFi) wireless local area network (WLAN) service provider.

The method of an embodiment further comprises storing the device identification information in at least one database, wherein the device identification information includes at least one of a device telephone number, at least one identification number associated with the mobile device and components of the mobile device, an International Mobile Subscriber Identity (IMSI), a Mobile Country Code (MCC), a Mobile Network Code (MNC), a Mobile Station Identification Number (MSIN), a Mobile Station International Integrated Service Digital Network (ISDN) Number (MSISDN), a Number Assignment Module (NAM), information of a subscriber, and the WiFi application identification information.

The mobile device of an embodiment includes at least one of cellular telephones, personal computers, portable computing devices, portable telephones, portable communication devices, subscriber devices or units, and personal digital assistants.

The mobile device of an embodiment includes cellular telephones having a single Subscriber Identity Module (SIM)/User Identity Module (UIM) card.

The method of an embodiment further comprises generating a call detail record during at least one time period during which the mobile device is accessing the WLAN application.

The method of an embodiment further comprises providing billing information to at least one billing system via a coupling to the billing system, wherein the billing information comprises information of at least one session during which the mobile device is accessing the WLAN application.

A system that couples among components of two or more communications service providers and roaming mobile communication devices is provided herein, comprising at least one of: means for monitoring communications between a first service provider and a mobile device; means for automatically gathering identification information of the mobile device; means for launching a service application under a second service provider and providing service application identification information to the mobile device; and means for controlling access to the service application in response to a request from the mobile device that includes the service application identification information.

A system that integrates GSM and WiFi services is provided herein. The system includes a device that integrates access to communication services and wireless local area network (WLAN) services by mobile devices, comprising at least one of: means for monitoring wireless channels between a first service provider and a mobile device; means for receiving device identification information of the mobile device via the monitoring; means for automatically transmitting a first wireless message to the mobile device in response to receipt of the device identification information; means for receiving a request for WLAN access from the mobile device; means for activating at least one WLAN application under a second service provider; means for automatically transmitting application identification information to the mobile device; means for receiving an authentication request to the WLAN application from the mobile device; and means for controlling access of the mobile device to the WLAN application in response to the authentication request.

A computer readable medium is provided herein including executable instructions which, when executed by a processing system, provides integrated communication services and wireless local area network (WLAN) services to mobile devices, by monitoring wireless channels between a first service provider and a mobile device, receiving device identification information via the monitoring, automatically transmitting a first wireless message to the mobile device in response to receipt of the device identification information, receiving a request for WLAN access from the mobile device, activating at least one WLAN application under a second service provider, automatically transmitting application identification information to the mobile device, receiving an authentication request to the WLAN application from the mobile device, and controlling access of the mobile device to the WLAN application in response to the authentication request.

Aspects of the integration service system described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the integration service system include: microcontrollers with memory (such as electronically erasable programmable read only memory (EEPROM)), embedded microprocessors, firmware, software, etc. Furthermore, aspects of the integration service system may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import shall refer to this application as a whole and not to any particular portions of this application. When the word "or" is used in reference to a list of two or more items, that word covers all of the following interpretations of the word: any of the items in the list, all of the items in the list and any combination of the items in the list.

The above description of embodiments of the integration service system is not intended to be exhaustive or to limit the system to the precise form disclosed. While specific embodiments of, and examples for, the integration service system are described herein for illustrative purposes, various equivalent modifications are possible within the scope of the system, as those skilled in the relevant art will recognize. The teachings of the integration service system provided herein can be applied to other processing systems and communication systems, not only for the systems described above.

The elements and acts of the various embodiments described above can be combined to provide further embodiments. These and other changes can be made to the system for maintaining electronic files in light of the above detailed description.

All of the above references and United States patents and patent applications are incorporated herein by reference. Aspects of the integration service system can be modified, if necessary, to employ the systems, functions and concepts of the various patents and applications described above to provide yet further embodiments of the system.

In general, in the following claims, the terms used should not be construed to limit the integration service system to the specific embodiments disclosed in the specification and the claims, but should be construed to include all processing systems that operate under the claims to provide integrated services like GSM and WiFi. Accordingly, the integration service system is not limited by the disclosure, but instead the scope of the system is to be determined entirely by the claims.

While certain aspects of the integration service system are presented below in certain claim forms, the inventor contemplates the various aspects of the system in any number of claim forms. For example, while only one aspect of the system is recited as embodied in computer-readable medium, other aspects may likewise be embodied in computer-readable medium. Accordingly, the inventor reserves the right to add additional claims after filing the application to pursue such additional claim forms for other aspects of the integration service system.

What I claim is:

1. A device comprising:
   a first system associated with a mobile network and coupled to monitor wireless channels between a mobile service provider and at least one mobile device and receive mobile device identification information in one or more signals monitored over the wireless channels, wherein the first system comprises a probe server;
   a second system coupled among the first system and a Wireless Fidelity (WiFi) application under a WiFi service provider that is different from the mobile service provider, wherein the second system advertises WiFi services to the at least one mobile device based at least in part on the mobile device identification information, activates the WiFi application in response to a request from the at least one mobile device, generates WiFi application identification information, and transmits the WiFi application identification information to the requesting mobile device, wherein the second system comprises a central server; and
   a third system coupled among the first and second systems that receives an authentication request to the WiFi application from the at least one mobile device, determines via monitoring using the probe server whether the at least one mobile device is registered with the mobile service provider, and continually controls access of the at least one mobile device to the WiFi application based on determining whether the at least one mobile device is registered with the mobile service provider according to one or more additional messages monitored over the wireless channels, wherein the third system comprises an authentication server.

2. The device of claim 1, wherein the request from the at least one mobile device is an electronic request for WiFi service access generated by the at least one mobile device based at least in part on the second system advertising the WiFi services.

3. The device of claim 1, wherein the second system transmits the WiFi application identification information to the at least one mobile device via a second wireless message, wherein the WiFi application identification information includes a personal identification number (PIN).

4. The device of claim 1, further comprising at least one database for storage of mobile device identification information that includes at least one of a device telephone number, at least one identification number associated with the mobile device and components of the mobile device, an International Mobile Subscriber Identity (IMSI), and the WiFi application identification information.

5. The device of claim 1, wherein the at least one mobile device includes at least one of cellular telephones, personal computers, portable computing devices, portable telephones, portable communication devices, subscriber devices or units, and personal digital assistants.

6. The device of claim 1, wherein the first communication link includes a cellular communication channel.

7. The device of claim 1, wherein the mobile service providers includes at least one Global System for Mobile Communications (GSM) service provider and the WiFi service provider includes at least one wireless local area network (WLAN) service provider.

8. A system that couples among components of two or more communications service providers and a mobile communication device, comprising:
   a probe server that automatically gathers identification information of the mobile communication device from one or more messages monitored over a wireless channel between a mobile service provider and the mobile communication device;
   a central server that launches a service application under a WiFi service provider in response to a request for WiFi access from the mobile communication device; and
   a short message service (SMS) center that transmits a SMS to the mobile communication device advertising WiFi services based at least in part on the identification information; and
   an authentication server that continually controls access of the mobile communication device to the WiFi services based on determining whether the mobile communication device is registered with the mobile service provider according to one or more additional messages monitored by the probe server over the wireless channel.

9. The system of claim 8, wherein the mobile service provider is a Global System for Mobile Communications (GSM) service provider.

10. The system of claim 8, further comprising an authentication server that continually determines based at least in part on the one or more messages monitored over the wireless channels whether the mobile communication device is registered with the mobile service provider and controls access of the mobile communication device to the service application based on whether the mobile communication device is registered with the mobile service provider.

11. A method for providing integrated communication services and wireless local area network (WLAN) services to at least one mobile device, comprising:
    monitoring wireless channels between a mobile service provider and the at least one mobile device;
    receiving device identification information via one or more messages monitored over the wireless channels;
    automatically transmitting a first wireless message advertising WLAN services to the at least one mobile device in response to receipt of the device identification information;
    receiving a request for WLAN access from the at least one mobile device;
    activating at least one WLAN application under a WiFi service provider that is different from the mobile service provider;
    automatically transmitting application identification information to the at least one mobile device;
    receiving an authentication request to the WLAN application from the at least one mobile device;

determining via the one or more messages monitored over the wireless channels whether the at least one mobile device is registered with the mobile service provider; and continually controlling access of the at least one mobile device to the WLAN application based on determining from one or more additional messages monitored over the wireless channel whether the at least one mobile device is registered with the mobile service provider and in response to the authentication request.

12. The method of claim 11, wherein the request for WLAN access is generated using information of the first wireless message.

13. The method of claim 11, wherein the first wireless message includes a Short Message Service (SMS) message.

14. The method of claim 11, further comprising generating application identification information associated with the WLAN application.

15. The method of claim 11, wherein the application identification information is transmitted to the at least one mobile device using a second wireless message.

16. The method of claim 15, wherein the second wireless message includes a Short Message Service (SMS) message.

17. The method of claim 11, wherein the mobile service provider includes a Global System for Mobile Communications (GSM) service provider.

18. The method of claim 11, further comprising storing the device identification information in at least one database, wherein the device identification information includes at least one of a device telephone number, at least one identification number associated with the at least one mobile device and components of the at least one mobile device, an International Mobile Subscriber Identity (IMSI), a Mobile Country Code (MCC), a Mobile Network Code (MNC), a Mobile Station Identification Number (MSIN), a Mobile Station International Integrated Service Digital Network (ISDN) Number (MSISDN), a Number Assignment Module (NAM), information of a subscriber, and the WiFi application identification information.

19. The method of claim 11, wherein the at least one mobile device includes at least one of cellular telephones, personal computers, portable computing devices, portable telephones, portable communication devices, subscriber devices or units, and personal digital assistants.

20. The method of claim 11, wherein the at least one mobile device includes cellular telephones having a single Subscriber Identity Module (SIM)/User Identity Module (UIM) card.

21. The method of claim 11, further comprising generating a call detail record during at least one time period during which the at least one mobile device is accessing the WLAN application.

22. The method of claim 11, further comprising providing billing information to at least one billing system via a coupling to the billing system, wherein the billing information comprises information of at least one session during which the at least one mobile device is accessing the WLAN application.

23. The method of claim 11, further comprising:
receiving a de-registration event in a message monitored over the wireless channels;
determining whether the at least one mobile device is accessing the WLAN application based at least in part on the receiving the de-registration event; and
automatically transmitting a message to the at least one mobile device requesting the at least one mobile device user to re-register with the mobile service provider where the determining includes determining that the at least one mobile device is accessing the WLAN application.

24. The method of claim 23, further comprising:
initiating a timer where the determining includes determining that the at least one mobile device is accessing the WLAN application; and
terminating the WLAN application where the at least one mobile device does not re-register before expiration of the timer.

25. The method of claim 23, further comprising:
initiating a timer where the determining includes determining that the at least one mobile device is accessing the WLAN application; and
receiving a registration event via the monitoring before expiration of the timer.

26. The method of claim 25, further comprising terminating the timer in response to receiving the registration event.

27. A system that couples among components of two or more communications service providers and at least one mobile communication device, comprising:
means for monitoring communications between a mobile service provider and the at least one mobile device;
means for automatically gathering identification information of the at least one mobile device based at least in part on one or more messages received by the means for monitoring communications;
means for launching a service application under a WiFi service provider and providing service application identification information to the at least one mobile device, wherein the WiFi service provider is different from the mobile service provider;
means for determining, from the one or more messages received by the means for monitoring, whether the at least one mobile device is registered with the mobile service provider; and
means for continually controlling access of the at least one mobile device to the service application based on the means for determining continually determining whether the at least one mobile device is registered with the mobile service provider based on the one or more messages and in response to a request from the at least one mobile device.

28. A device that integrates access to communication services and wireless local area network (WLAN) services by at least one mobile device, comprising:
means for monitoring wireless channels between a mobile service provider and the at least one mobile device;
means for receiving device identification information of the at least one mobile device based at least in part on one or more messages received by the means for monitoring over the wireless channels;
means for automatically transmitting a first wireless message to the at least one mobile device advertising WiFi services in response to receipt of the device identification information;
means for receiving a request for WLAN access from the at least one mobile device;
means for activating at least one WLAN application under a WiFi service provider that is different from the mobile service provider;
means for automatically transmitting application identification information to the at least one mobile device;
means for receiving an authentication request to the at least one WLAN application from the at least one mobile device;

means for determining based at least in part on the one or more messages received by the means for monitoring whether the at least one mobile device is registered with the mobile service provider; and means for continually controlling access of the at least one mobile device to the at least one WLAN application based on the means for determining continually determining whether the at least one mobile device is registered with the mobile service provider and in response to the authentication request.

29. A computer readable non-transitory medium including executable instructions which, when executed by a processing system, provides integrated communication services and wireless local area network (WLAN) services to at least one mobile device, by:

monitoring wireless channels between a mobile service provider and the at least one mobile device;

receiving device identification information from one or more messages monitored over the wireless channels automatically transmitting a first wireless message to the at least one mobile device advertising WiFi services in response to receipt of the device identification information;

receiving a request for WLAN access from the at least one mobile device; activating at least one WLAN application under a WiFi service provider that is different from the mobile service provider;

automatically transmitting application identification information to the at least one mobile device;

receiving an authentication request to the at least one WLAN application from the at least one mobile device;

determining from the one or more messages monitored over the wireless channels whether the at least one mobile device is registered with the mobile service provider; and continually controlling access of the at least one mobile device to the at least one WLAN application based on whether the at least one mobile device is registered with the mobile service provider and in response to the authentication request.

30. A method for providing integrated communication services and wireless local are network (WLAN) services to mobile devices, comprising:

monitoring wireless channels between a mobile service provider and a mobile device;

receiving device identification information from one or more messages monitored over the wireless channels;

automatically transmitting a first wireless message to the mobile device advertising WiFi services in response to receipt of the device identification information;

receiving a request for WLAN access from the mobile device;

activating at least one WLAN application under a WiFi service provider that is different from the mobile service provider;

determining from the one or more messages monitored over the wireless channels whether the mobile device is registered with the mobile service provider; and continually controlling access of the mobile device to the at least one WLAN application based on whether the mobile device is registered with the mobile service provider.

31. The method of claim 30, wherein determining whether the mobile device is registered with the mobile service provider comprises:

receiving a de-registration event in a message monitored over the wireless channels;

determining whether the mobile device is accessing the WLAN application based at least in part on the receiving the de-registration event; and automatically transmitting a message to the mobile device requesting the mobile device user to re-register with the mobile service provider where the determining includes determining that the at least one mobile device is accessing the WLAN application.

32. The method of claim 31, further comprising:

initiating a timer where the determining includes determining that the at least one mobile device is accessing the WLAN application; and terminating the WLAN application where the at least one mobile device does not re-register before expiration of the timer.

33. The method of claim 31, further comprising:

initiating a timer where the determining includes determining that the at least one mobile device is accessing the WLAN application; and receiving a registration event via the monitoring before expiration of the timer.

34. The method of claim 33, further comprising terminating the timer in response to receiving the registration event.

35. A method for providing integrated communication services and wireless local area network (WLAN) services to mobile devices, comprising:

monitoring wireless channels between a mobile service provider and a mobile device;

receiving device identification information from one or more messages monitored over the wireless channels;

automatically transmitting a first wireless message to the mobile device in response to receipt of the device identification information;

receiving a request for WLAN access from the mobile device;

activating at least one WLAN application under a WiFi service provider that is different from the mobile service provider;

continually determining from the one or more messages monitored over the wireless channels whether the mobile device is registered with the mobile service provider; and controlling access to the second WiFi provider based on the continually determining whether the mobile device is registered with the mobile service provider.

* * * * *